(12) United States Patent
Gittemeier

(10) Patent No.: US 10,700,023 B2
(45) Date of Patent: *Jun. 30, 2020

(54) HIGH-POWER AMPLIFIER PACKAGE

(71) Applicant: MACOM Technology Solutions Holdings, Inc., Lowell, MA (US)

(72) Inventor: Timothy Gittemeier, Holly Springs, NC (US)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/935,996

(22) Filed: Mar. 26, 2018

(65) Prior Publication Data

US 2019/0006297 A1 Jan. 3, 2019

Related U.S. Application Data

(63) Continuation of application No. 15/158,163, filed on May 18, 2016, now Pat. No. 9,960,127.

(51) Int. Cl.
*H01L 23/34* (2006.01)
*H01L 23/36* (2006.01)
(Continued)

(52) U.S. Cl.
CPC .......... *H01L 23/66* (2013.01); *H01L 21/8258* (2013.01); *H01L 23/057* (2013.01); *H01L 23/34* (2013.01); *H01L 23/36* (2013.01); *H01L 23/367* (2013.01); *H01L 24/05* (2013.01); *H01L 24/85* (2013.01); *H01L 25/072* (2013.01);
(Continued)

(58) Field of Classification Search
CPC .................. H01L 23/34; H01L 23/36; H01L 23/367–3677; H01L 23/373–3738; H01L 23/48–50; H01L 2223/6683
See application file for complete search history.

(56) References Cited

U.S. PATENT DOCUMENTS 4,842,699 A 6/1989 Hua et al.
4,910,583 A 3/1990 Behr et al.
(Continued)

FOREIGN PATENT DOCUMENTS

CN 104347579 A 2/2015
CN 204836090 U 12/2015
(Continued)

OTHER PUBLICATIONS

International Search Report and Written Opinion for Application No. PCT/US2016/049813 dated Feb. 15, 2017.
International Search Report and Written Opinion for Application No. PCT/US2017/024279 dated Jul. 12, 2017.
(Continued)

*Primary Examiner* — Thanhha S Pham
(74) *Attorney, Agent, or Firm* — Thomas | Horstemeyer, LLP

(57) ABSTRACT

Package assemblies for improving heat dissipation of high-power components in microwave circuits are described. A laminate that includes microwave circuitry may have cut-outs that allow high-power components to be mounted directly on a heat slug below the laminate. Electrical connections to circuitry on the laminate may be made with wire bonds. The packaging allows more flexible design and tuning of packaged microwave circuitry.

15 Claims, 5 Drawing Sheets

(51) Int. Cl.
*H01L 23/66* (2006.01)
*H01L 21/8258* (2006.01)
*H01L 23/367* (2006.01)
*H01L 23/057* (2006.01)
*H01L 25/07* (2006.01)
*H03F 1/02* (2006.01)
*H03F 3/193* (2006.01)
*H03F 3/60* (2006.01)
*H01L 27/06* (2006.01)
*H01L 23/00* (2006.01)
*H01L 29/20* (2006.01)
*H03F 3/21* (2006.01)

(52) U.S. Cl.
CPC ...... *H01L 27/0605* (2013.01); *H01L 29/2003* (2013.01); *H03F 1/0288* (2013.01); *H03F 3/193* (2013.01); *H03F 3/211* (2013.01); *H03F 3/604* (2013.01); *H01L 24/45* (2013.01); *H01L 24/48* (2013.01); *H01L 2223/6611* (2013.01); *H01L 2223/6655* (2013.01); *H01L 2224/04042* (2013.01); *H01L 2224/45014* (2013.01); *H01L 2224/45144* (2013.01); *H01L 2224/4847* (2013.01); *H01L 2224/48091* (2013.01); *H01L 2224/48227* (2013.01); *H01L 2224/48247* (2013.01); *H01L 2224/48463* (2013.01); *H01L 2224/49111* (2013.01); *H01L 2924/00014* (2013.01); *H01L 2924/13091* (2013.01); *H01L 2924/1902* (2013.01); *H01L 2924/19105* (2013.01); *H03F 2203/21131* (2013.01)

(56) References Cited

U.S. PATENT DOCUMENTS

| | | | |
|---|---|---|---|
| 4,985,742 A | 1/1991 | Pankove | |
| 5,122,845 A | 6/1992 | Manabe et al. | |
| 5,192,987 A | 3/1993 | Khan et al. | |
| 5,200,641 A | 4/1993 | Kosaki | |
| 5,239,188 A | 8/1993 | Takeuchi et al. | |
| 5,296,395 A | 3/1994 | Khan et al. | |
| 5,389,571 A | 2/1995 | Takeuchi et al. | |
| 5,393,993 A | 2/1995 | Edmond et al. | |
| 5,438,212 A | 8/1995 | Okaniwa | |
| 5,449,930 A | 9/1995 | Zhou | |
| 5,519,252 A | 5/1996 | Soyano et al. | |
| 5,523,589 A | 6/1996 | Edmond et al. | |
| 5,703,399 A | 12/1997 | Majumdar et al. | |
| 5,739,554 A | 4/1998 | Edmond et al. | |
| 5,741,724 A | 4/1998 | Ramdani et al. | |
| 5,760,426 A | 6/1998 | Marx et al. | |
| 5,796,165 A | 8/1998 | Yoshikawa et al. | |
| 5,838,706 A | 11/1998 | Edmond et al. | |
| 5,864,171 A | 1/1999 | Yamamoto et al. | |
| 5,874,747 A | 2/1999 | Redwing et al. | |
| 5,905,275 A | 5/1999 | Nunoue et al. | |
| 5,928,421 A | 7/1999 | Yuri et al. | |
| 5,982,000 A | 11/1999 | Leighton et al. | |
| 6,045,626 A | 4/2000 | Yano et al. | |
| 6,051,849 A | 4/2000 | Davis et al. | |
| 6,060,331 A | 5/2000 | Shakouri et al. | |
| 6,060,730 A | 5/2000 | Tsutsui | |
| 6,064,082 A | 5/2000 | Kawai et al. | |
| 6,069,394 A | 5/2000 | Hashimoto et al. | |
| 6,084,895 A | 7/2000 | Kouchi et al. | |
| 6,121,121 A | 9/2000 | Koide | |
| 6,121,634 A | 9/2000 | Saito et al. | |
| 6,153,010 A | 11/2000 | Kiyoku et al. | |
| 6,177,688 B1 | 1/2001 | Linthicum et al. | |
| 6,201,262 B1 | 3/2001 | Edmond et al. | |
| 6,236,116 B1 | 5/2001 | Ma | |
| 6,239,033 B1 | 5/2001 | Kawai | |
| 6,255,198 B1 | 7/2001 | Linthicum et al. | |
| 6,261,929 B1 | 7/2001 | Gehrke et al. | |
| 6,265,289 B1 | 7/2001 | Zheleva et al. | |
| 6,291,880 B1 | 9/2001 | Ogawa et al. | |
| 6,346,728 B1 | 2/2002 | Inoue et al. | |
| 6,355,497 B1 | 3/2002 | Romano et al. | |
| 6,380,108 B1 | 4/2002 | Linthicum et al. | |
| 6,403,451 B1 | 6/2002 | Linthicum et al. | |
| 6,426,512 B1 | 7/2002 | Ito et al. | |
| 6,441,393 B2 | 8/2002 | Goetz et al. | |
| 6,486,502 B1 | 11/2002 | Sheppard et al. | |
| 6,489,636 B1 | 12/2002 | Goetz et al. | |
| 6,586,781 B2 | 7/2003 | Wu et al. | |
| 6,611,002 B2 | 8/2003 | Weeks et al. | |
| 6,617,060 B2 | 9/2003 | Weeks et al. | |
| 6,621,162 B1* | 9/2003 | Ishida .............. | H01P 3/088 257/700 |
| 6,649,287 B2 | 11/2003 | Weeks, Jr. et al. | |
| 6,956,250 B2 | 10/2005 | Borges et al. | |
| 7,061,080 B2 | 6/2006 | Jeun et al. | |
| 7,221,042 B2 | 5/2007 | Bambridge | |
| 8,350,369 B2 | 1/2013 | Lee et al. | |
| 9,252,067 B1 | 2/2016 | Kumar | |
| 9,960,127 B2 | 5/2018 | Gittemeier | |
| 10,134,658 B2 | 11/2018 | Mkhitarian et al. | |
| 2001/0000733 A1 | 5/2001 | Tomioka | |
| 2001/0002048 A1 | 5/2001 | Koike et al. | |
| 2001/0008656 A1 | 7/2001 | Tischler et al. | |
| 2001/0040245 A1 | 11/2001 | Kawai | |
| 2001/0040247 A1 | 11/2001 | Ando et al. | |
| 2002/0020341 A1 | 2/2002 | Marchand et al. | |
| 2002/0030195 A1 | 3/2002 | Yoshii et al. | |
| 2002/0074552 A1 | 6/2002 | Weeks, Jr. et al. | |
| 2002/0098693 A1 | 7/2002 | Kong et al. | |
| 2002/0117681 A1 | 8/2002 | Weeks et al. | |
| 2002/0117695 A1 | 8/2002 | Borges et al. | |
| 2003/0102494 A1 | 6/2003 | Akamine et al. | |
| 2006/0138654 A1 | 6/2006 | Yoshida | |
| 2006/0205161 A1 | 9/2006 | Johan et al. | |
| 2008/0157222 A1 | 7/2008 | Wang | |
| 2011/0100681 A1 | 5/2011 | Kimmich et al. | |
| 2012/0032190 A1 | 2/2012 | Takagi | |
| 2012/0091986 A1 | 4/2012 | Takemae et al. | |
| 2013/0175628 A1 | 7/2013 | McIntyre et al. | |
| 2014/0191809 A1 | 7/2014 | Kamiyama et al. | |
| 2015/0035080 A1 | 2/2015 | Akira et al. | |
| 2015/0076506 A1 | 3/2015 | Yasumoto et al. | |
| 2015/0179741 A1 | 6/2015 | Umeda et al. | |
| 2015/0263002 A1 | 9/2015 | Matsumoto et al. | |
| 2015/0279982 A1 | 10/2015 | Yamamoto et al. | |
| 2015/0311332 A1 | 10/2015 | Zhang et al. | |
| 2016/0056150 A1 | 2/2016 | Nagai et al. | |
| 2016/0233211 A1 | 8/2016 | Miura et al. | |
| 2017/0338194 A1 | 11/2017 | Gittemeier | |
| 2018/0047656 A1 | 2/2018 | Mkhitarian et al. | |
| 2019/0214330 A1 | 7/2019 | Mkhitarian et al. | |

FOREIGN PATENT DOCUMENTS

| | | |
|---|---|---|
| DE | 199 31 300 A1 | 2/2000 |
| EP | 0 079 265 A1 | 5/1983 |
| EP | 0 293 630 A1 | 12/1988 |
| EP | 0563873 A2 | 10/1993 |
| EP | 0 740 376 A1 | 10/1996 |
| EP | 0 804 054 A1 | 10/1997 |
| EP | 0 852 416 A1 | 7/1998 |
| EP | 0 951 055 A2 | 10/1999 |
| EP | 1085594 A2 | 3/2001 |
| FR | 2 167 271 A1 | 8/1973 |
| FR | 2 381 388 A1 | 9/1978 |
| FR | 2 809 534 A1 | 11/2001 |
| GB | 1599852 A | 10/1981 |
| JP | S58-079773 A | 5/1983 |
| JP | H01-149461 A | 6/1989 |
| JP | H04-163970 A | 6/1992 |
| JP | S59-163865 A | 9/1994 |
| JP | H07-202325 A | 8/1995 |
| JP | H09-326534 A | 12/1997 |
| JP | H10-051065 A | 2/1998 |

(56) References Cited

FOREIGN PATENT DOCUMENTS

| | | |
|---|---|---|
| JP | H10-135519 A | 5/1998 |
| JP | H10-189800 A | 7/1998 |
| JP | H10-242584 A | 9/1998 |
| JP | H10242377 A | 9/1998 |
| JP | H10-321909 A | 12/1998 |
| JP | H11-087526 A | 3/1999 |
| JP | H11150228 A | 6/1999 |
| JP | 2000-114275 A | 4/2000 |
| JP | 2000-133842 A | 5/2000 |
| JP | 2000-261035 A | 9/2000 |
| JP | 2000-277441 A | 10/2000 |
| JP | 2004 288948 A | 10/2004 |
| WO | WO 00/33365 A1 | 6/2000 |
| WO | WO 01/37327 A1 | 5/2001 |
| WO | WO 01/43174 A2 | 6/2001 |
| WO | WO 01/47002 A2 | 6/2001 |
| WO | WO 01/59819 A1 | 8/2001 |
| WO | WO 01/93310 A1 | 12/2001 |
| WO | WO 03/037048 A1 | 5/2003 |
| WO | WO 2015/028839 A1 | 3/2015 |

OTHER PUBLICATIONS

Written Opinion of the International Preliminary Examining Authority for Application No. PCT/US2016/049813 dated Apr. 6, 2018.
Ch. II International Preliminary Report on Patentability for International Application No. PCT/US2016/049813, dated Sep. 19, 2018.
Written Opinion of the International Preliminary Examining Authority for International Application No. PCT/US2017/024279, dated Jul. 13, 2018.
Ch. II International Preliminary Report on Patentability for International Application No. PCT/US2017/024279, dated Nov. 6, 2018.
International Search Report and Written Opinion for International Application No. PCT/US2019/045340, dated Jan. 2, 2020.
U.S. Appl. No. 16/165,261, Mkhitarian et al., filed Oct. 19, 2018.
Invitation to Pay Additional Fees for International Application No. PCT/US2019/045340, dated Oct. 29, 2019.
International Search Report for International Application No. PCT/US2002/005182, dated Oct. 23, 2002.
International Preliminary Examination Report for International Application No. PCT/US2002/005182, dated May 12, 2003.
Extended European Search Report for European Application No. 15154907.8, dated Jun. 17, 2015.
Extended European Search Report for European Application No. 19172826.0, dated Sep. 23, 2019.
International Search Report for International Application No. PCT/US2002/005460, dated Sep. 16, 2002.
International Preliminary Examination Report for International Application No. PCT/US2002/005460, dated May 7, 2003.
Extended European Search Report for European Application No. 19173082.9, dated Sep. 25, 2019.
Ishikawa et al., High-Quality GaN on Si Substrate Using AlGaN/AlN Intermediate Layer. Phys Stat Sol A. 1999;176:599-603.
Semond et al., GaN grown on Si(111) substrate: from two-dimensional growth to quantum well assessment. Appl Phys Lett. 1999;75(1):82-4.

\* cited by examiner

HIGH-POWER AMPLIFIER PACKAGE

RELATED APPLICATION DATA

This Application is a divisional continuation application of U.S. application Ser. No. 15/158,163, titled "High-Power Amplifier Package" filed May 18, 2016, the entire contents of which is incorporated herein by reference in its entirety.

BACKGROUND

Technical Field

The technology relates to packaged, high-power microwave circuitry, such as high-power microwave amplifiers.

Discussion of the Related Art

Gallium-nitride semiconductor material has received appreciable attention in recent years because of its desirable electronic and electro-optical properties. Gallium nitride (GaN) has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, gallium nitride is more resistant to avalanche breakdown and has a higher intrinsic field strength compared to more common semiconductor materials, such as silicon and gallium arsenide. In addition, gallium nitride is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, high-power, and high-power applications. For example, gallium-nitride materials may be used as active circuit components in semiconductor amplifiers for radio-frequency (RF) communications, radar, and microwave applications.

SUMMARY

Packaging assemblies for high-power microwave circuits are described. According to some embodiments, a packaging assembly includes a laminate having microwave circuitry and cut-outs that allow direct mounting of high-power components, such as GaN transistors, on a heat slug in the package. Wire bonds can provide connections between the high-power components and microwave circuitry on the laminate. The direct mounting of the high-power components to the heat slug can provide improved thermal dissipation, so that higher power operation may be achieved, and permit flexibility in design of the microwave circuitry. For example, the microwave circuit's design may be iterated more rapidly and components may be exchanged in a partially assembled package to tune the circuit to a particular application, all without affecting or exchanging the high-power components.

Some embodiments relate to a high-power microwave circuit assembled in a package comprising a microwave circuit formed on a laminate, a case supporting conductive leads that are connected to the microwave circuit, and a heat slug connected to the case and extending from an interior region of the case to an exterior region of the case. There may be one or more cut-outs in the laminate. A first power transistor may be mounted directly on the heat slug within a cut-out of the laminate and connected to the microwave circuit.

Some embodiments relate to a method of assembling a high-power amplifier in a package. The method may comprise a combination of acts including, but not limited to: mounting a power transistor on a heat slug; separately placing a laminate with a microwave circuit over the heat slug, wherein the power transistor is located within a cut-out in the laminate; electrically connecting terminals of the power transistor to the microwave circuit with interconnects that extend through the cut-out to the microwave circuit; and forming a case that connects to the heat slug and encloses the microwave circuit.

Various configurations of high-power amplifier packages may be implemented. Some configurations include, but are not limited to, the following embodiments.

A high-power microwave circuit assembled in a package comprising: a microwave circuit formed on a laminate; a case supporting conductive leads that are connected to the microwave circuit; a heat slug connected to the case and extending from an interior region of the case to an exterior region of the case; a cut-out in the laminate; and a first power transistor mounted directly on the heat slug within the cut-out of the laminate and connected to the microwave circuit.

A high-power amplifier circuit, wherein the first power transistor is capable of outputting power levels between 50 W and 100 W at duty cycles greater than 50% without significant degradation of the amplifier's performance.

A high-power amplifier circuit, wherein the first power transistor is capable of outputting power levels between 100 W and 200 W at duty cycles greater than 50% without significant degradation of the amplifier's performance.

A high-power amplifier circuit, wherein the first power transistor comprises GaN.

A high-power amplifier circuit, further comprising a second power transistor mounted directly on the heat slug in a second cut-out in the laminate and having an output connected to an input of the first power transistor.

A high-power amplifier circuit, further comprising a second power transistor mounted directly on the heat slug in a second cut-out in the laminate and connected in parallel with the first power transistor in a Doherty configuration.

A high-power amplifier circuit, wherein the package complies with specifications for a standardized package.

A high-power amplifier circuit, wherein the microwave circuit comprises conductive interconnects, at least one resistor, and at least three capacitors.

A high-power amplifier circuit, wherein the laminate is mounted directly on the heat slug.

A high-power amplifier circuit, further comprising first wire bonds connecting terminals of the first power transistor to the microwave circuit.

A high-power amplifier circuit, wherein there is more than one wire bond connecting in parallel one terminal of the first power transistor to the microwave circuit.

A high-power amplifier circuit, further comprising second wire bonds that connect the conductive leads to the microwave circuit, wherein the second wire bonds are of the same diameter as the first wire bonds and connected in the same way as the first wire bonds.

A high-power amplifier circuit, wherein a height differential between bonding pads on the first power transistor and conductive interconnects on the microwave circuit is between approximately 5 mils and approximately 20 mils.

A high-power amplifier circuit, further comprising a capacitor having a breakdown voltage between 200V and 500V mounted on the laminate.

A high-power amplifier circuit, further comprising an inductor patterned in the laminate.

Various methods for making high-power amplifier packages may be practiced. Method embodiments may include, but not be limited to, one or more of the following acts suitably combined.

A method of assembling a high-power amplifier in a package comprising acts of: mounting a power transistor on a heat slug; separately placing a laminate with a microwave circuit over the heat slug, wherein the power transistor is located within a cut-out in the laminate; electrically connecting terminals of the power transistor to the microwave circuit with interconnects that extend through the cut-out to the microwave circuit; and forming a case that connects to the heat slug and encloses the microwave circuit.

A method, of further comprising electrically connecting leads that extend through the case to the microwave circuit, wherein a same process is used to electrically connect the terminals of the power transistor to the microwave circuit and electrically connect the leads to the microwave circuit.

A method, of, wherein the process comprises wire bonding.

A method, wherein placing the laminate over the heat slug comprises mounting the laminate directly to the heat slug.

A method, wherein the microwave circuit includes at least one resistor and at least three capacitors.

A method, further comprising interchanging one of the at least three capacitors for a capacitor of a different value to tune operation of the high-power amplifier.

A method, further comprising operating the power transistor to output a power level between 100 W and 200 W.

A method, wherein forming the case comprises forming the case to comply with specifications for a standardized package.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. A depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. The terms "on" and "over" are used for ease of explanation relative to the illustrations, and are not intended as absolute directional references. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

As described above, transistors comprising gallium nitride material are useful for high-speed, high-voltage, and high-power applications because of the favorable material properties of gallium nitride. Some applications relating to RF communications, radar, and microwaves can place demanding performance requirements on devices that include gallium-nitride transistors. For example, some applications may require high-power transistors capable of amplifying signals to power levels between approximately 50 Watts and approximately 200 Watts.

Figure 1:
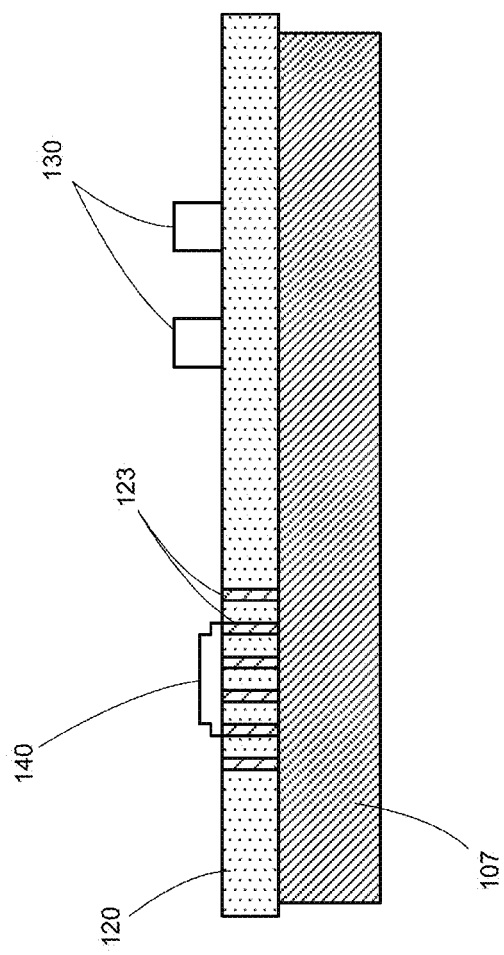
FIG. 1 depicts one approach to dissipating heat from a packaged power transistor.

The inventor has recognized and appreciated that at such high power levels, efficient thermal dissipation is needed to remove heat from transistors within a power amplifier package. One approach to dissipating heat from a packaged power transistor is depicted in FIG. 1. The drawing depicts a power transistor 140 and electrical components 130 (e.g., a capacitor, inductor, or resistor) of a circuit that is formed on a laminate 120. A plurality of thermally conductive vias 123 (sometimes referred to as a "via farm") may be formed in the laminate to improve heat transfer from the power transistor 140 to a heat slug 107. A benefit to this approach is that the power transistor 140 may be manufactured as a surface-mount die that may be readily mounted on the laminate with other electrical components to form a microwave circuit. In some cases, the laminate may be soldered to a printed circuit board (PCB).

The inventor has recognized and appreciated that via farms may not provide adequate thermal dissipation for some high-power components in certain applications. For example, where a power transistor of an amplifier outputs signals at power levels over 50 W, via farms may inadequately dissipate heat from the transistor so that the transistor's performance degrades. For example, the gain linearity or drain efficiency may degrade. Additionally, the via farms may take up an appreciable area of the laminate making it difficult to mount more than two discrete capacitors on the laminate within the package. This can make it difficult or impossible to implement impedance matching within the package for the microwave circuit.

The inventor has further recognized and appreciated that although power transistors can be readily incorporated on a monolithic microwave integrated circuit (MMIC), a turn-around time for changes in a MMIC design (e.g., to tune performance of an amplifier) can be months. This is because there is no way to readily retune a MMIC, so that the MMIC needs to be refabricated. However, the inventor has recognized and appreciated that turn-around times for redesign of laminate circuitry can be days.

Figure 2A:
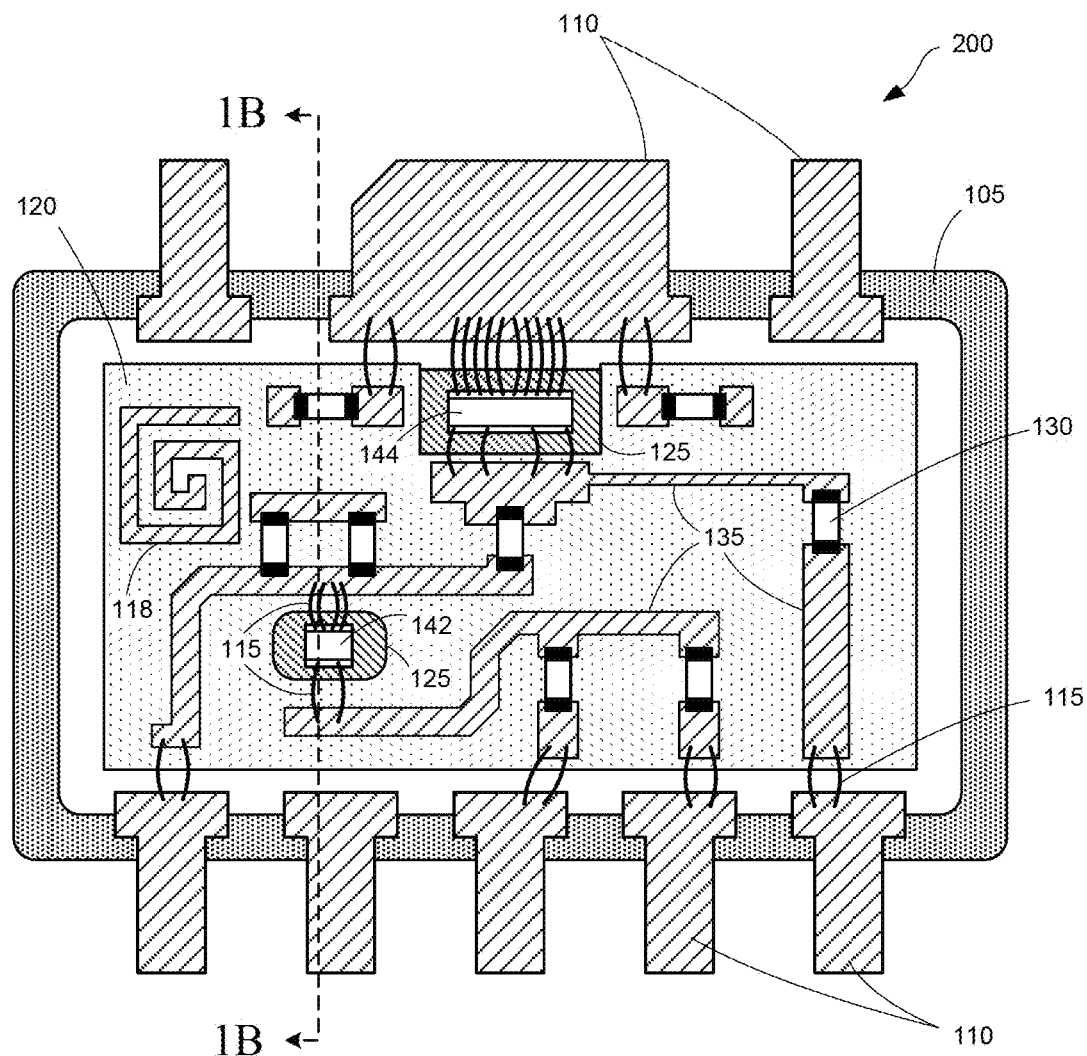
FIG. 2A depicts a plan view of a high-power amplifier package, according to some embodiments.
Figure 2B:
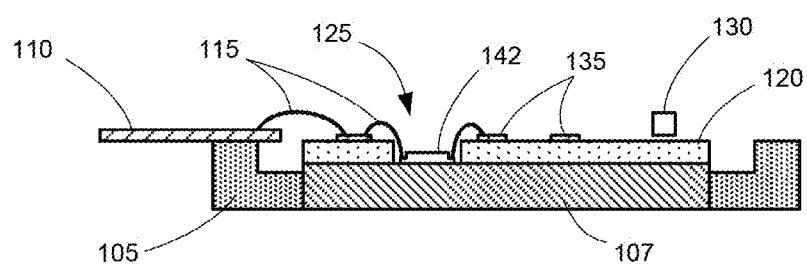
FIG. 2B depicts an elevation view corresponding to the section line of FIG. 2A, according to some embodiments.

An improved approach to packaging high-power transistors or other high-power components is depicted in FIG. 2A and FIG. 2B. According to some embodiments, high-power components 142, 144 (such as GaN transistors) may be mounted directly on a heat slug 107 through cut-outs 125 in a laminate 120. Wire bonds 115 may be used to connect between terminals on the high-power components and microwave circuitry on the laminate 120. The direct mounting of the high-power components on the heat slug can improve heat dissipation into the heat slug and allow the components to operate at higher power levels than is possible for conventionally packaged, high-power devices. For example, a device having direct mounting of transistors on the heat slug 107 may operate at power levels between about 50 W and about 100 W at duty cycles greater than 50% without appreciable performance degradation (e.g., without appreciable degradation of gain, linearity, or drain efficiency). In some implementations, a device having direct mounting of transistors on the heat slug 107 may operate at power levels between about 100 W and about 200 W at duty cycles greater than 50% without appreciable performance degradation due to heating. For example, a power transistor mounted on a laminate typically exhibits a gain reduction of about 0.5 dB to about 1 dB due to heating considerations for pulsed and continuous-wave operation compared to a transistor mounted directly on a heat slug. For a laminate-mounted transistor, there is a higher thermal resistance to the heat slug. The increased thermal resistance causes the transistor to get hotter and limits its maximum operating temperature. Therefore, the transistor must be operated at reduced gain values (by about 0.5 dB to about 1 dB) to avoid overheating and damaging the transistor. Direct mounting of the transistor on the heat slug can allow higher-power operation to recover about 0.5 dB to about 1 dB of gain.

The phrases "direct mounting" and "mounted directly on the heat slug" refer to bonding, adhering, or otherwise attaching a transistor or other high-power component directly to the heat slug through a cut-out in the laminate. In some embodiments, there may be a layer of thermally-conductive adhesive between the high-power component and the heat slug.

In some embodiments, the high-power components 142, 144 may comprise high-power GaN transistors, such as a high-power, depletion-mode, high-electron-mobility transistor (HEMT), high-voltage GaN-on-Si FET, and high-voltage heterojunction bipolar transistor (HBT). In some embodiments, a transistor may be formed as a junction field-effect transistor (JFET) or low-voltage HBT. Other transistor architectures may be used in other embodiments. Other transistor architectures may include, but not be limited to, metal-oxide-semiconductor field-effect transistor (MOSFET) and metal-insulator-semiconductor field-effect transistor (MISFET). In some cases, the high-power components 142, 144 may be of mixed types. For example, a first stage of an amplifier may comprise first component 142 that is a low-voltage transistor (e.g., a 5V HBT) and a second stage may comprise a second component 144 that is a 50V GaN-on-Si FET. In other embodiments, high-power components may include, but not be limited to, high-power GaN diodes, LEDs or laser diodes, high-power thyristors or other similar or different high-power devices which may or may not be formed from GaN.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_yN_{(1-x-y)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium nitride material layer to have a composition of GaN (i.e., x=y=a=b=0). For example, an active layer in which a transistor channel is formed may have a composition of GaN. Gallium nitride materials may be doped n-type or p-type, or may be intrinsic. Suitable gallium nitride materials are described in U.S. Pat. No. 6,649,287, which is incorporated herein by reference in its entirety.

Referring again to FIG. 2A, a high-power package 200 may include an outer case 105, a laminate 120 mounted within the case 105 that includes microwave circuitry and cut-outs 125, a heat slug 107 mounted in the case, and one or more conductive pins or leads 110 extending through the case walls, at least some of which provide electrical connections to circuitry on the laminate. The laminate circuitry may comprise discrete components 130 (e.g., resistors, diodes, capacitors, inductors, etc.) and include patterned conductive interconnects 135. In some embodiments, the laminate may comprise multiple levels of conductive interconnects and one or more ground planes separated by dielectric material. The laminate may have a thickness between approximately 5 mils and approximately 30 mils, according to some embodiments, though other thicknesses may be used in some cases. Examples of suitable laminates are produced by Rogers Corporation of Rogers, Conn., such as the RO3000® laminates. A suitable laminate may have a high dielectric constant (e.g., greater than 2), and be formed from a ceramic-filled polytetrafluoroethylene (PTFE) composite, though other laminate compositions may be used in some cases. A laminate 120 may include cut-outs 125 that provide openings through the laminate. There may be conductive interconnects or bond pads for wire bonds formed adjacent to the cut-outs.

When the laminate is mounted within the package 200, there may be one or more high-power components 142, 144 located within the cut-outs 125. A high-power component may be formed as a semiconductor die and may be mounted directly on an underlying heat slug 107. One or more wire bonds may be made between terminals on each high-power component and adjacent conductive interconnects or bond pads that connect to conductive interconnects on the laminate 120.

When using the terms "on," "adjacent," or "over" in to describe the relative locations of a first item and a second item (e.g., structure A is adjacent to structure B), there may or may not be intervening material between the first item and the second item. When a first item is described as being "immediately" on, adjacent to, or over a second item, essentially no intervening material is present. When a first item is described as being "on" or "over" a second item, the first item may cover the entire second item, or a portion of the second item.

The heat slug 107 may comprise any suitable material that exhibits a high thermal conductivity, such as copper or aluminum, though other materials may be used. The heat slug may extend through the case 105, so that it can directly contact an external heat sink. In some embodiments, the package 200 may include holes or other features that allow the package to be screwed or otherwise securely fastened to an instrument board, for example, so that the heat slug 107 makes intimate contact with a heat sink on the instrument board. In some implementations, the heat slug 107 may provide a ground plane or reference potential for circuitry on the laminate.

The case 105 may comprise a plastic or molded epoxy in some embodiments, and the package may be formed in a standardized shape (e.g., a TO-272 package, an AC-400 package, an AC-780 package etc.). FIG. 2A and FIG. 2B depict a decapped portion of a package. In embodiments, the case 105 may extend or be over-molded above the laminate to enclose the laminate 120 and high-power components 142, 144.

By providing cut-outs 125 in the laminate 120, mounting of the high-power devices 142, 144 is separated from assembly of the laminate. Typically, high-power components formed from materials other than Si contribute higher costs to packaged high-power devices. By using a laminate in a package, some components (e.g., resistors, capacitors, inductors, impedance-matching networks, voltage bias networks, etc.) may be formed at lower-cost (using surface-mount devices (SMDs), printed components on the laminate, Si-based dies, etc.) rather than forming them on or from a more expensive semiconductor, as might be done for a MMIC that is formed from a more costly semiconductor wafer. In some embodiments, the high-power components 142, 144 can be made small in size compared to a MMIC, and therefore reduce costs.

A further consideration is that revising a MMIC can require one or several months of turn-around time and loss of an expensive device. On the other hand, revising laminate circuitry, without integrated high-power components, can entail only several days of delay. Additionally, discrete components on a laminate may be changed more readily (prior to assembly in a package or after partial assembly in a package) to fine tune packaged devices for a particular application or frequency range when expensive high-power devices are not integrated on the laminate. For example, there is no risk of damaging the high-power devices when interchanging discrete components on the laminate.

An additional benefit of mounting the high-power components on the heat slug within the cut-outs is that the cut-outs can occupy less area than via farms, so that more laminate area is available for impedance-matching and/or filtering circuitry. In some implementations, power management circuitry may be included inside the package 200.

There are also additional benefits to using a laminate 120 in combination with high-power components rather than manufacturing a device as a MMIC. MMIC technology typically has limited breakdown voltages (in the range of 50 V to 100 V) for integrated capacitors. To increase the capacitance breakdown voltage to over 200 V, the capacitor's dielectric layer would need to become significantly thicker (e.g., at least double). Current SMD capacitors, which can be used on a laminate, can have breakdown voltages as high as 500 V. Additionally, SMD inductors or inductors 118 patterned from a conductive layer on the laminate can exhibit appreciably higher Q values than inductors formed on a MMIC, and are of lower cost. SMD and laminate inductors can exhibit lower loss and handle higher current levels than MMIC inductors.

According to some embodiments, the laminate 120 may also be mounted directly on the heat slug 107, as depicted in FIG. 2B, or it may be mounted within a few mils above the heat slug. By mounting the laminate directly on the heat slug, a height differential between bonding pads on a high-power component 142 and conductive interconnects 135 on the laminate is reduced. For example, the height differential may be between about 5 mils and about 20 mils. This can allow a same electrical connection process (e.g., wire or ribbon bonding) to be used for making electrical connections between the high-power component and microwave circuitry on the laminate and between leads 110 and the microwave circuitry.

A high-power component 142, 144 mounted in a package 200 may include a plurality of bond wires 115 connected to a same terminal of the component, as depicted in FIG. 2A. For example, there may be more than one bond wire connected to a gate terminal or drain terminal of a power transistor. The wire bonds may be spaced apart on a regular pitch in some cases, or may be spaced on an irregular pitch. The pitch of bond wires 115 connected to a same terminal may be between approximately 0.1 mm and approximately 0.5 mm. The bond wires may comprise gold or any other suitable metal. In some implementations, the bond wires may be connected to conductive interconnects or bond pads using a ball bond or wedge bond for example. In some cases, ribbon bonds may be used instead of, or in addition to, bond wires.

According to some embodiments, a high-power amplifier package 200 may include one or more impedance-matching networks and/or biasing networks. An impedance-matching network may transform input and output impedances to and from a high-power transistor, for example, to match impedances of adjacent circuitry to which the transistor connects. For example, an impedance-matching network connected to a gate of a power transistor may transform the input impedance of the transistor to an impedance value (e.g., approximately 50 Ohms) that better matches an output impedance of upstream circuitry to which the gate connects. Impedance-matching networks may comprise any suitable combination of resistors, capacitors, inductors, and transmission line segments, and may be designed to approximately match impedances at a selected operating frequency (sometimes referred to as a "fundamental frequency") or over frequency range for the amplifier. An operating frequency may be between approximately 500 MHz and approximately 6 GHz, according to some implementations, or may be between approximately 1 GHz and approximately 6 GHz, though some embodiments may be designed for lower or higher frequencies. A high-power amplifier package 200 may further include capacitive shunts and/or filters to reduce or terminate power at the second harmonic and/or higher harmonics of the fundamental frequency, or to suppress noise.

In some embodiments, a voltage bias network may be included in a high-power amplifier package 200. A voltage bias network may include a separate negative voltage generator die, for example, that is soldered or otherwise connected to circuitry on the laminate 120. The voltage bias network may be configured to generate and provide an appropriate negative gate bias to the GaN power transistors prior to biasing drains of the power transistors, so as to avoid damaging the power transistors. In some embodiments, the voltage bias network may generate one or more negative bias levels from a fixed voltage input received by the package 200.

Figure 3:
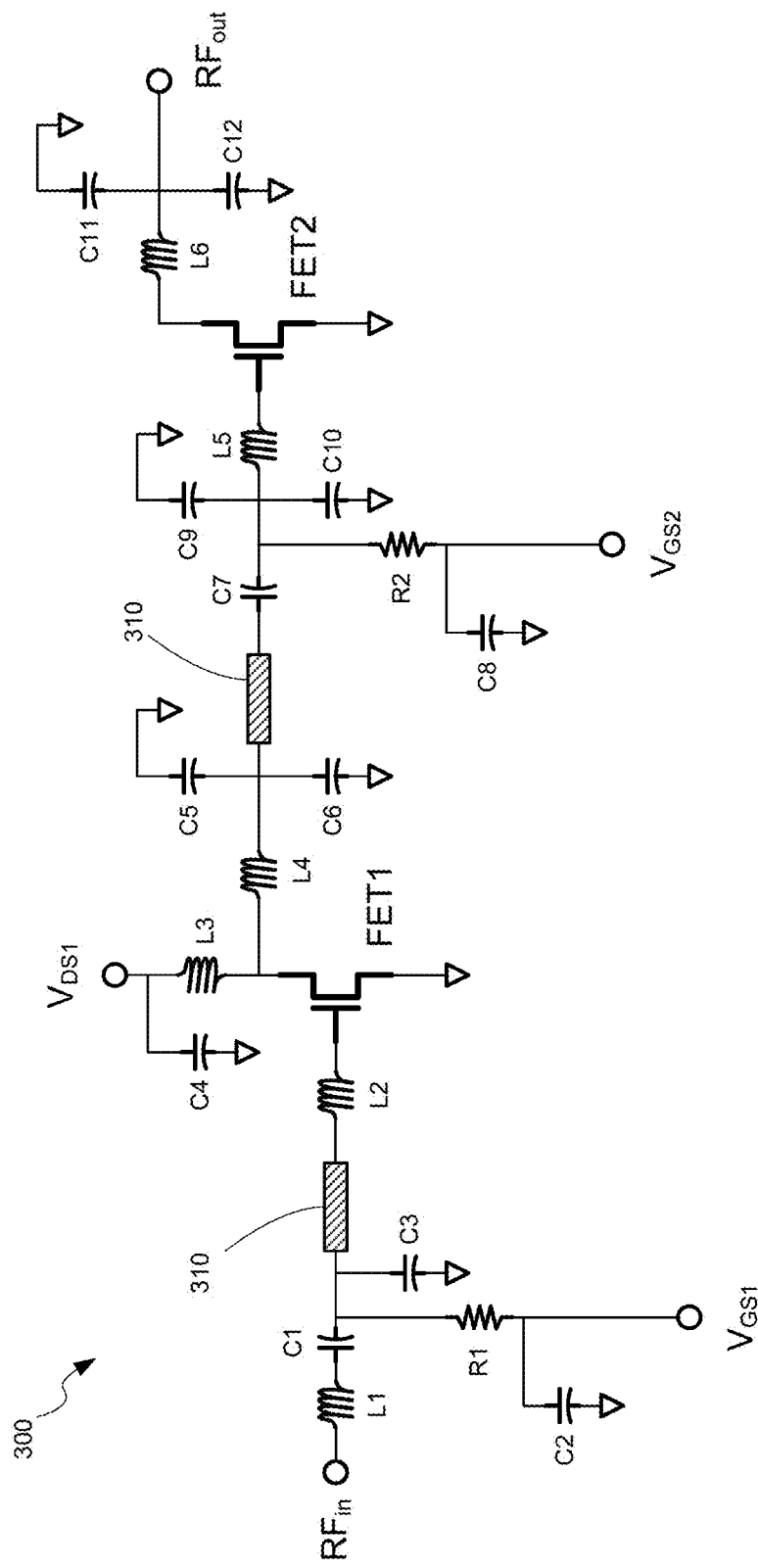
FIG. 3 shows an example circuit for a two-stage, high-power amplifier package.

FIG. 3 depicts just one example of amplification circuitry 300 that may be included in a high-power amplifier package 200, though the invention is not limited only to amplifiers. According to some embodiments, a high-power amplifier may be a multistage amplifier having a first power transistor PT1 and a second power transistor PT2. Wire bonds within the package 200 may contribute inductances L1-L6 to the circuit. Discrete capacitors C1-C12 and resistors R1, R2 (which may be surface mount components) may be included in the circuit for impedance matching, biasing, and filtering. For example, resistors R1, R2 and capacitors C2, C8 may be arranged to bias the gates of transistors PT1, PT2. Shunt capacitors C5, C6 and C11, C12 may be arranged to suppress harmonics at the outputs of the transistors. The circuitry 300 may further include transmission line segments 310 of selected lengths that rotate impedance values at gate inputs of the transistors to better match output impedances of upstream circuits.

The amplifier circuitry 300 may be tuned to a desired operating frequency or frequency range by selecting resistor and capacitor component values for a particular operating frequency or frequency range. Inductance values may be changed by adding or removing bond wires to bond-wire groups where two or more wire bonds are made to a same terminal, for example. In some implementations, discrete inductors may be included in the circuit. Transmission line segment lengths and properties may be changed by changing a laminate design.

The tuning process for a microwave circuit may be performed with the assistance of numerical simulation or using empirical methods. For example, tuning may be implemented using a software tool such as Advanced Design System (ADS) available from Keysight Technologies, Inc. of Santa Rosa, Calif. Other suitable software tools include, but are not limited to NI AWR Design Environment available from AWR Corporation of El Segundo, Calif. and Sonnet® software tools available from Sonnet Software of North Syracuse, N.Y.

Although the above structures and circuits have been described primarily for gallium-nitride transistors, other semiconductor materials may be used in other embodiments that use high-power, high-speed transistors or other high-power components. Some embodiments may include heterojunction transistors comprising SiC, SiGe, GaAs, InP, and CdTe. Direct mounting of high-power transistors on heat slugs in power-amplifier packages may be useful for various types of amplifiers including, but not limited to, class-A, class-B, class-J, class-F, inverse class-F, class-AB, and Doherty amplifiers. For example, a Doherty amplifier configuration may be included within the package 200 where transistors in the parallel amplification paths are mounted directly on the heat slug.

There are various processes that may be used to assemble high-power amplifier packages, such as the package 200 depicted in FIG. 2A. Structures associated with methods for assembling a packaged high-power amplifier are depicted in FIG. 4A to FIG. 4D.

Figure 4A:
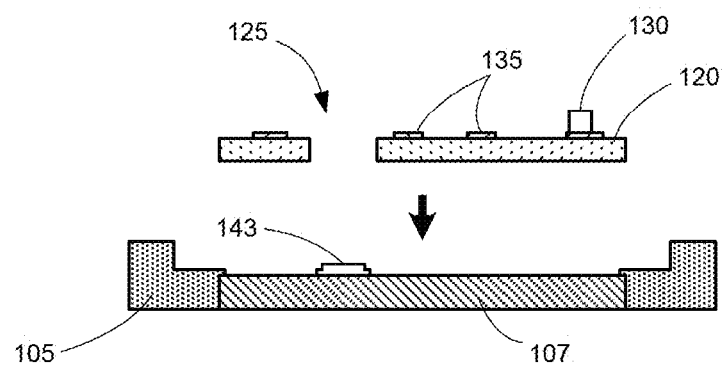
FIG. 4A depicts a structure associated with assembly of a high-power amplifier package, according to some embodiments.

According to some embodiments, a method for assembling a packaged high-power amplifier may comprise mounting a power transistor 143 directly on a heat slug 107, as depicted in FIG. 4A. The power transistor may be adhered, bonded, or otherwise placed in thermal contact with the heat slug. The heat slug may be mounted within or otherwise connected to a case 105 in some embodiments. In other embodiments, the case may be formed or attached around the heat slug after the power transistor and/or laminate is/are mounted over the heat slug.

Figure 4B:
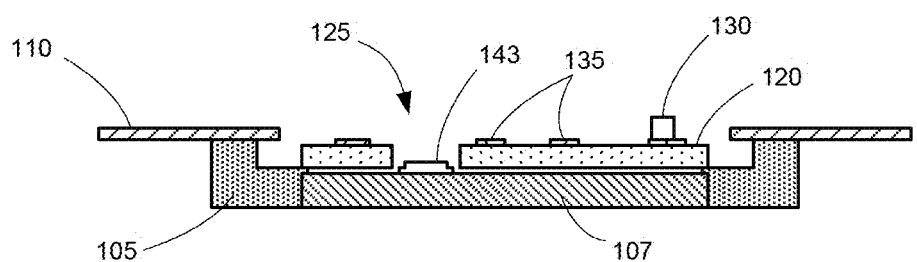
FIG. 4B depicts a structure associated with assembly of a high-power amplifier package, according to some embodiments.

A method of assembly may comprise mounting a laminate 120 with microwave circuitry over the heat slug, such that the power transistor 143 is located within a cut-out 125 of the laminate, as depicted in FIG. 4B. The laminate may, or may not, contact the heat slug. Conductive leads 110 may be mounted adjacent to the laminate and microwave circuitry.

Figure 4C:
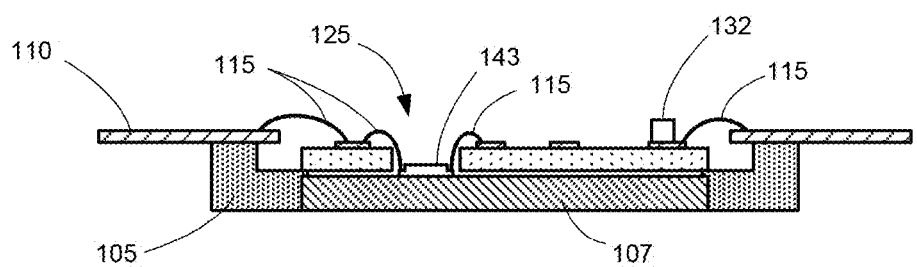
FIG. 4C depicts a structure associated with assembly of a high-power amplifier package, according to some embodiments.
Figure 4D:
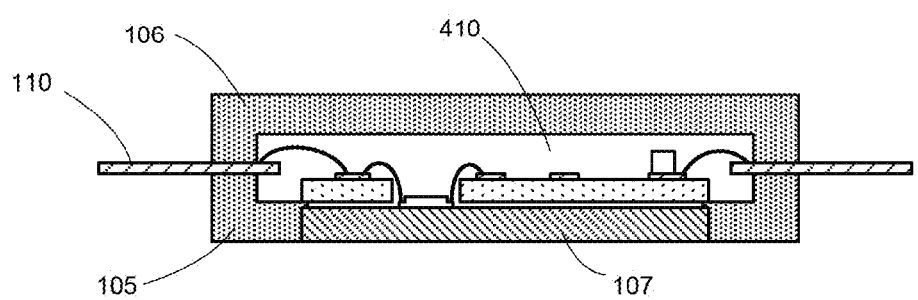
FIG. 4D depicts a structure associated with assembly of a high-power amplifier package, according to some embodiments.

A method of assembly may comprise making electrical connections between terminals on the power transistor 143 and the microwave circuitry, and between the leads 110 and the microwave circuitry, as depicted in FIG. 4C. According to some embodiments, the electrical connections may be made using a same wire-bonding process (e.g., using bond wires having a same diameter and bonded in the same manner). In some cases, a discrete component 130 may be replaced with a component 132 of a different value (e.g., different capacitance or different resistance) after the laminate has been mounted to tune operation of the microwave circuitry to a particular application (e.g., a particular operating frequency, frequency range, or gain characteristic).

A method of assembly may include enclosing the laminate and power transistor with an upper case 106. The upper case may be bonded to the lower case 105, or may be formed by over-molding in place. In some embodiments, an interior region 410 may be filled with an insulating material, or may be filled by the upper case material.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high-power amplifier circuit assembled in a package comprising:
   a microwave circuit formed on a laminate;
   a case supporting conductive leads that are connected to the microwave circuit;
   a heat slug connected to the case and extending from an interior region of the case to an exterior region of the case;
   a cut-out in the laminate; and
   a first power transistor mounted directly on the heat slug within the cut-out of the laminate and connected to the microwave circuit.

2. The high-power amplifier circuit of claim 1, wherein the first power transistor is capable of outputting power levels between 50 W and 100 W at duty cycles greater than 50% without significant degradation of the amplifier's performance.

3. The high-power amplifier circuit of claim 1, wherein the first power transistor is capable of outputting power levels between 100 W and 200 W at duty cycles greater than 50% without significant degradation of the amplifier's performance.

4. The high-power amplifier circuit of claim 3, wherein the first power transistor comprises GaN.

5. The high-power amplifier circuit of claim 4, further comprising a second power transistor mounted directly on the heat slug in a second cut-out in the laminate and having an output connected to an input of the first power transistor.

6. The high-power amplifier circuit of claim 4, further comprising a second power transistor mounted directly on the heat slug in a second cut-out in the laminate and connected in parallel with the first power transistor in a Doherty configuration.

7. The high-power amplifier circuit of claim 3, wherein the package complies with specifications for a standardized package.

8. The high-power amplifier circuit of claim 7, wherein the microwave circuit comprises conductive interconnects, at least one resistor, and at least three capacitors.

9. The high-power amplifier circuit of claim 1, wherein the laminate is mounted directly on the heat slug.

10. The high-power amplifier circuit of claim 9, further comprising first wire bonds connecting terminals of the first power transistor to the microwave circuit.

11. The high-power amplifier circuit of claim 10, wherein there is more than one wire bond connecting in parallel one terminal of the first power transistor to the microwave circuit.

12. The high-power amplifier circuit of claim 10, further comprising second wire bonds that connect the conductive leads to the microwave circuit, wherein the second wire bonds are of the same diameter as the first wire bonds and connected in the same way as the first wire bonds.

13. The high-power amplifier circuit of claim 9, wherein a height differential between bonding pads on the first power transistor and conductive interconnects on the microwave circuit is between approximately 5 mils and approximately 20 mils.

14. The high-power amplifier circuit of claim 1, further comprising a capacitor having a breakdown voltage between 200V and 500V mounted on the laminate.

15. The high-power amplifier circuit of claim 1, further comprising an inductor patterned in the laminate.

* * * * *